United States Patent [19]

Yamakage et al.

[11] Patent Number: 5,393,985
[45] Date of Patent: Feb. 28, 1995

[54] APPARATUS FOR FOCUSING AN ION BEAM

[75] Inventors: Yasuhiro Yamakage, Kyoto; Shinji Nagamachi, Osaka, both of Japan

[73] Assignee: Shimadzu Corporation, Kyoto, Japan

[21] Appl. No.: 154,424

[22] Filed: Nov. 19, 1993

[30] Foreign Application Priority Data

Nov. 26, 1992 [JP] Japan .................................. 4-317323
Nov. 30, 1992 [JP] Japan .................................. 4-319921

[51] Int. Cl.⁶ ...................... H01J 37/317; H01J 37/26
[52] U.S. Cl. ...................................... 250/398; 250/309; 250/492.1
[58] Field of Search .................... 250/398, 309, 492.21

[56] References Cited

U.S. PATENT DOCUMENTS 4,924,104  5/1990  Stengl et al. ..................... 250/398
5,196,706  3/1993  Keller et al. ..................... 250/398

FOREIGN PATENT DOCUMENTS 59-171444  9/1984  Japan ............................... 250/309

*Primary Examiner*—Jack I. Berman
*Attorney, Agent, or Firm*—Nikaido, Marmelstein, Murray & Oram

[57] ABSTRACT

A focused ion beam apparatus which includes an ion source, an extraction electrode for extracting ion beams from the ion source, a condenser lens for focusing the ion beam, a mass spectrometer for separating a desired ion species from the extracted ion beams, a target stage adapted to support a target, deflection electrodes for deflecting the ion beam taken from the mass spectrometer, and guiding same to the target on the stage, wherein the condenser lens group includes an objective lens located immediately before the target stage, and including a decelerating field circuit for forming a decelerating field between the target stage and the outermost electrode of the objective lens, the deflection electrode having a two-stage structure consisting of a first and second group of deflection electrodes in the advancing direction of ion beam, wherein the ion beam deflected by the deflection electrodes is caused to pass through the center of the objective lens irrespective of the amount of beam deflection.

9 Claims, 5 Drawing Sheets

APPARATUS FOR FOCUSING AN ION BEAM

FIELD OF THE INVENTION

The present invention relates generally to apparatus for depositing metal in a fine pattern on a substrate by applying a focused ion beam thereto. The apparatus is used for forming electronic devices and correcting same.

BACKGROUND OF THE INVENTION

A typical example of depositing metal on a substrate with the use of a focused ion beam is an ion beam-assisted CVD. This type of CVD method consists of introducing gaseous organic metal into a vacuum prepared immediately before a target, and irradiating the gas with a focused ion beam so as to decompose the gas into metallic atoms which are deposited on the target.

However, the ion beam-assisted CVD is disadvantageous in that the quality of the resulting metallic film is spoiled with unwanted atoms contained as impurities.

The inventors have found the effectiveness of another method which consists of generating ions from a source, separating a desired ion therefrom by means of a mass spectrometer, and scanning and guiding the selected ion to the target at an appropriately decelerated speed. In this way a metal thin film is formed in a desired pattern on the target, the metal film having a line width in the order of submicron. This method is advantageous in that the resulting film is safe from impurities, thereby enhancing the quality of the film.

Referring to FIG. 8, the apparatus used for performing the known methods will be described:

The focused ion beam apparatus includes a liquid metal ion source 81 for storing a suitable metal, and a target stage 87, wherein the source 81 and the stage 87 are located at opposite ends of the apparatus. Between the source 81 and the stage 87 are electrodes 82, a mass spectrometer including an electrostatic lens 83a and a mass filter 84a, an electrostatic lens 83b, a single stage of deflection electrodes 85, and a decelerating electrode 86 interposed.

An ion beam extracted from the ion source 81 at an accelerated speed is focused by the first electrostatic lens 83a, and a desired ion species is selected and separated by the mass spectrometer 84a and 84b. The separated ion beam is focused by the second electrostatic lens 83b (hereinafter referred to as "objective lens") and decelerated to a desired level of energy by a decelerating field existing between the decelerating electrode 86 and the target W before it reaches the target W.

The ion beam is deflected by controlling a voltage applied to the deflection electrodes 85 interposed between the objective lens 83b and the decelerating electrode 86.

The conventional focused ion beam apparatus described above has disadvantages in (1) that the objective lens 83b are unavoidably located at a relatively long distance from the target stage, thereby enlarging the diameter of a beam spot formed on the target W, and (2) that since the beam is deflected after it is focused by the objective lens 83b, aberration is likely to arise and expand the diameter of ion beam particularly when the ion beam deflects at an excessively large angle. These factors (1) and (2) prevent the beam spot on the target from being focused as intensely as desired. Thus it is difficult to achieve a fine, delicate pattern.

In addition, the known focused ion beam apparatus is disadvantageous in that a scanning ion microscope (SIM) cannot be used to direct the beam exactly to the target by watching the beam position unlike the ion beam assisted CVD method. In contrast, the ion beam assisted CVD method is advantageous in that the same ion beam can be used for twofold purposes; one is to watch the target by detecting secondary electrons emitted from the target, thereby facilitating the positioning of the ion beam with respect to the target, and the other is to perform the CVD method.

The focused ion beam direct deposition method is disadvantageous in that the decelerating field provided to slow down the focused ion beam immediately before the target tends to push back secondary electrons toward the target. As a result, the secondary electrons fail to reach the SIM detector, thereby making it impossible to use the focused ion beam decelerated for deposition to locate the ion beam against the target. In this method, therefore, it is required to project the ion beam against the target without preparing the decelerating field. Nevertheless, the ion beam is adversely affected by the decelerating field which is provided for performing the ion deposition; that is, the paths of the non-decelerated ion beam and the decelerated ion beam come into disaccord with each other because of the difference in speed. If a pattern is determined on the basis of an SIM image, the resulting pattern tends to become larger than expected because the ions flow at a decelerated speed for a prolonged period of time.

The direct deposition method requires a sufficiently strong decelerating field to prevent the ions from dispersing but any mechanical dislocation of the electrode tends to dislocate a pattern to be deposited.

SUMMARY OF THE INVENTION

The present invention is directed to solve the problems discussed above with respect to the conventional focused ion beam apparatus, and it is an object to provide a focused ion beam apparatus which minimizes the diameter of an ion beam spot.

Another object of the present invention is to provide a focused ion beam apparatus which ensures that a desired pattern is directly deposited exactly at a desired place on the substrate by using an image of the scanning ion microscope (SIM).

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, there is provided a focused ion beam apparatus which comprises an ion source, an extraction electrode for extracting an ion beam from the ion source, a condenser lens for focusing the ion beam, a mass spectrometer for separating a desired ion species from those extracted from ion beams, a target stage adapted to support a target, deflection electrodes for deflecting the ion beam taken from the mass spectrometer, and guiding same to the target on the stage, an objective lens located immediately before the target stage, and comprising a decelerating field circuit for forming a decelerating field between the target stage and the outermost electrode of the objective lens, the deflection electrode having a two-stage structure consisting of a first and second group of deflection electrodes in the advancing direction of ion beam, wherein the ion beam deflected by the deflection electrodes is caused to pass through the center of the objective lens irrespective of the amount of beam deflection.

According to another aspect of the present invention, there is provided a focused ion beam apparatus which comprises an ion source, an extraction electrode for extracting ion beam from the ion source, a condenser lens and an objective lens for focusing the ion beam, a mass spectrometer for separating a desired ion species from the extracted ion beams, a target stage adapted to support a target, a beam scanning means for determining an ion beam incident position of the ion beam separated by the mass spectrometer, means for forming a decelerating field immediately before the target stage, an SIM image detector located adjacent to the target stage, a videorizing means for visualizing an SIM image on the basis of an output from the detector and information from the beam scanning means, an input unit for inputting data on the shape and position of a pattern to be deposited by the incident ion beam by reference to the SIM image formed by the videorizing means, and a compensation means for supplying a control signal to the beam scanning means after the input is appropriately compensated, the compensation means being capable of compensating the content of input in response to a beam path deviation occurring when a decelerating field is formed, against when no decelerating field is formed.

BRIEF DESCRIPTION OF THE DRAWINGS

The present invention may be better understood and its numerous objects and advantages will become apparent to those skilled in the art by reference to the accompanying drawings as follows.

DETAILED DESCRIPTION OF THE PREFERRED EMBODIMENT

Figure 1:
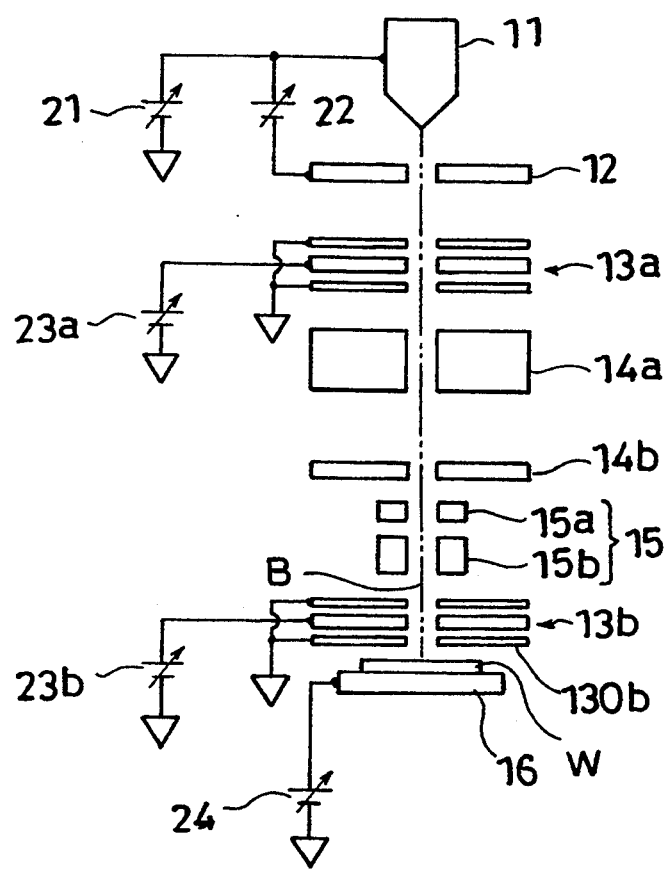
FIG. 1 is a schematic sectional view showing an optical system used in the apparatus of the present invention.

Referring to FIG. 1, the exemplary apparatus includes an optical system which includes a liquid metal ion source 11 fitted with a heater (not shown) for keeping molten metal. The molten metal is positively charged by an accelerating source 21. In addition, the optical system includes an extraction electrode 12, a focusing lens group including a first electrostatic lens 13a and a second electrostatic lens 13b, a mass spectrometer including mass filters 14a and an aperture 14b, a deflection electrode group 15 and a target stage 16 on which a target W is placed. The optical system is encased in a vacuum chamber (not shown for simplicity).

The extraction electrode 12 are located adjacent to an outlet of the liquid metal ion source 11 with a power source 22 interposed therebetween which applies such a sufficient voltage as to generate ions therefrom.

The first electrostatic lens 13a (hereinafter called "condenser lens") is disposed adjacent to the electrodes 12, and subsequently the mass spectrometer including the mass filter 14a and the aperture 14b is disposed. The mass filter 14a is an E×B filter whereby a desired ion species is selected and caused to pass through the aperture 14b while the other kinds of ions are trapped by the aperture 14b.

Subsequently to the aperture 14b, the deflection electrode group 15 is disposed, which includes a first group of deflection electrodes 15a upward and a second group of deflection electrodes 15b downward, which will be described below in greater detail.

Below the first group of deflection electrodes 15a are disposed the second group of electrostatic lens 13b (hereinafter called "objective lens"). The target stage 16 is disposed adjacent to the objective lens 13b by taking the center of the objective lens 13b and the position of the deflection electrode group 15 into consideration. The positional relationship among them will be described below. The objective lens 13b and the condenser lens 13a each are composed of three electrodes among which the middle electrodes are connected to power sources 23a and 23b, respectively, and those at each outermost electrodes are connected to earth.

The target stage 16 is positively charged by the power source 24 so that a field can exist between the target stage 16 and an outermost electrode 130b of the objective lens 13b.

Figure 2:
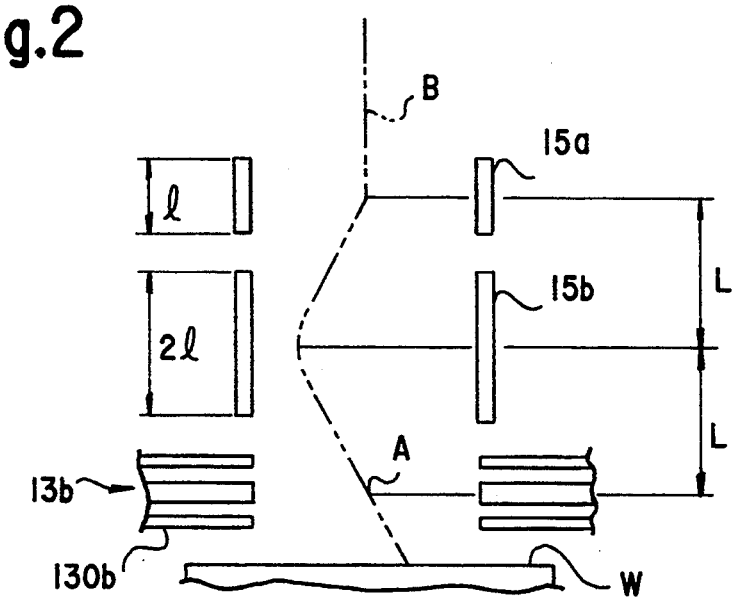
FIG. 2 is a cross-sectional view on an enlarged scale showing the deflection electrodes and the surroundings thereabout.
Figure 3A:
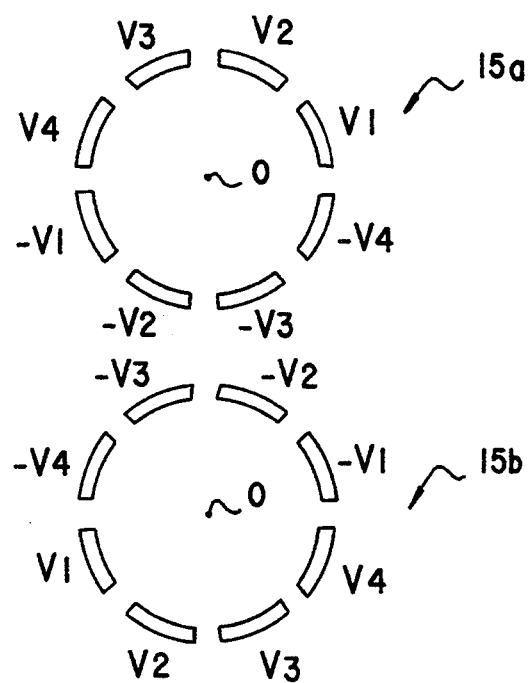
FIGS. 3(A) and (B) are plan views showing the relationship between the deflection electrodes and voltages applied thereto.
Figure 3B:
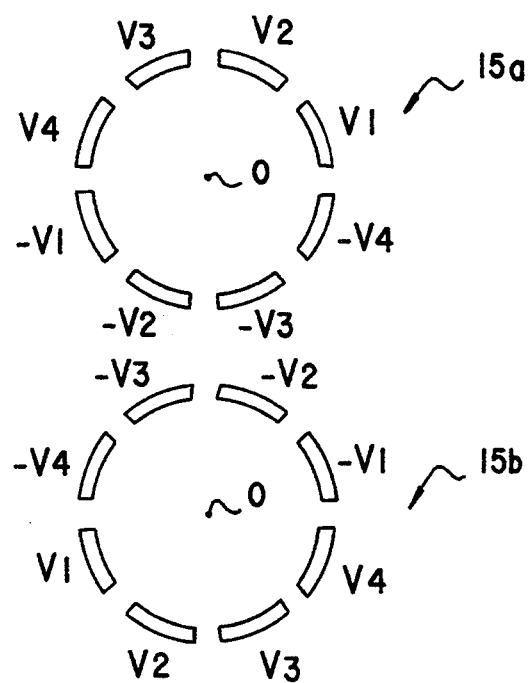

Referring to FIGS. 2, 3A, and 3B, the deflection electrode group 15 will be described in greater detail:

Each of the first deflection electrodes 15a and the second deflection electrodes 15b is an octapole electrode. Each of the second deflection electrodes 15b has a length of 2 1 in a direction in which the ion beam flows. This length is two times the length 1 of the first deflection electrodes 15a. The pole pieces of the deflection electrodes 15a and those of the deflection electrodes 15b which are diametrically opposite to the respective central lines O (optical axis) are charged with electric potential of opposite polarity. The pole pieces of the first and second deflection electrodes which are vertically aligned are charged with the opposite polarity. Each pole piece is charged with potential by deflection sources (not shown) whose output voltage is controlled on the basis of deflection data. The pole pieces of the first and second deflection electrodes vertically aligned are connected to the same source so that they are constantly charged with the opposite polarity, as shown in FIG. 3.

In operation, an ion beam generated at a high level of energy from the ion source 11 is focused by the condenser lens 13a. Then, a desired species of ion beams is selected by the mass filter 14a and the aperture 14b, and it is led as a beam B to the deflection electrode group 15.

In this way the beam B is first deflected in a desired direction by the first deflection electrodes 15a, and then it is deflected in an opposite direction by the second deflection electrodes 15b. Since each of the second deflection electrode 15b is twice as long as each of the first deflection electrode 15a in a direction in which the beam B flows, the beam B is deflected in the opposite direction at twice larger angle than that by the first deflection electrode 15a. Suppose that the distance between the centers of the first and second deflection electrodes 15a and 15b in a direction in which the beam B flows is L. Then, the beam B passes through point A at the distance L from the center of the second deflection electrode 15b toward the target stage 16 irrespective of what angle the deflection occurs.

The objective lens 13b is disposed with its center being located at the point A, which means that the beam B is focused by passing through the center of the objective lens 13b after it is deflected by the deflection electrodes 15. The beam B continues to have an energy initially given by the accelerating source 21 until it passes through the objective lens 13b. The beam B gradually loses energy in the decelerating field existing between the outermost objective lens 130b and the target stage 16. In this way the beam B reaches a target W on the target stage 16 with energy equal to the potential difference between the accelerating source 21 and the retarding source 24.

It should be noted in the first example that the objective lens 13b are located immediately before the target stage 16, and a decelerating field is formed between the outermost electrode 130b and the target stage 16. The ion beam B is caused to pass through the center of the objective lens irrespective of what angle the beam deflects at. The ion beam B appropriately loses energy and is focused so that it keeps a proper diameter free from aberration due to deflection and reaches a target W, thereby forming a delicate, fine pattern thereon. In this way a desired kind of metal can be directly deposited on the target W in a desired pattern.

For the liquid metal ion source 11, alloys containing superconductive metal such as Nb can be used; for example, Nb—Au—Co and Nb—Au—Cu, and Nb ion is selected by mass separation and is caused to lose speed. In this way the Nb superconductive thin film is formed in pattern on the target W.

Figure 4A:
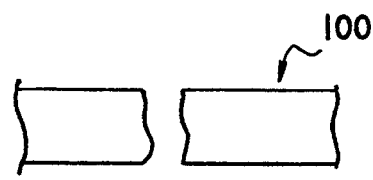
FIGS. 4(A) and (B) are schematic views showing a method of repairing a superconductive device as an application of a second example of the present invention.
Figure 4B:
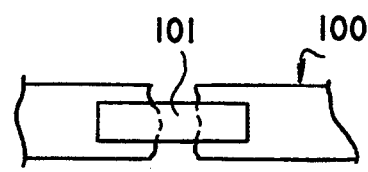
Figure 8:
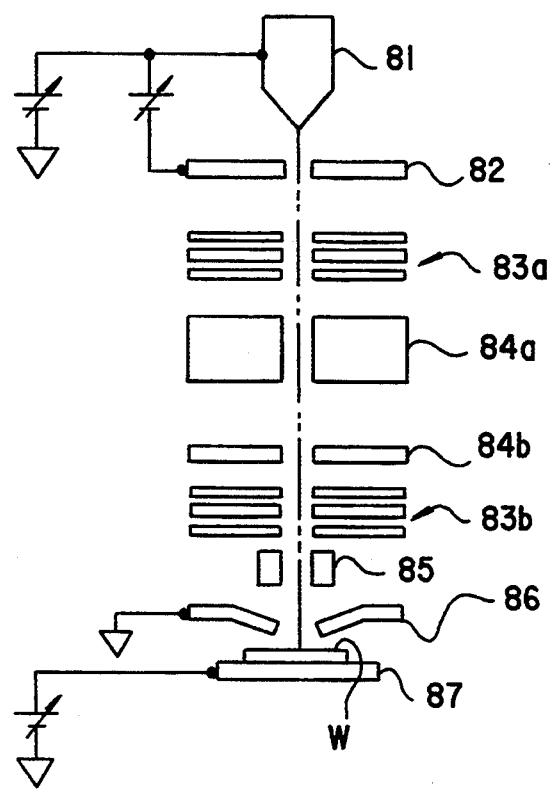
FIG. 8 is a schematic sectional view showing an optical system used in the known apparatus.

The apparatus of the present invention can be used to repair superconductive devices; more specifically, the circuit pattern of superconductive devices are liable to failure in the manufacturing process. The failure includes two cases; one is that no pattern is formed in required areas (black failure) and the other is that a pattern is formed in non-required areas (white failure) as shown in FIG. 4(B).

Under the known apparatus the black failure can be repaired by sputter-etching but the white failure cannot be repaired by any means. However, according to, the present invention Nb ion is selected by the mass filter 14a and the aperture 14b to obtain a flux of Nb ion beam and control its speed so as to impart it an energy of 50 to 200 e V when it reaches the target W. In this way a pattern 41 is readily formed over a white failure as shown in FIG. 4(B).

In the repair operation, if the energy of the ion beam at which it reaches a target is set to 1 keV or more, the target is likely to be sputter-etched, which means that the repairing method can be also applied to remove a black failure in a circuit.

Repair operations are applicable not only to superconductive devices but when Au and Al ions are to be used, they are also applicable to liquid crystal displays, integrated circuits and electronic devices.

In addition, according to the present invention the apparatus can facilitate the beam positioning with the use of an image of the scanning ion microscope (SIM), thereby enhancing its own working efficiency. When repair is needed for removing white failure, the apparatus of the present invention is of particular advantage.

Figure 5:
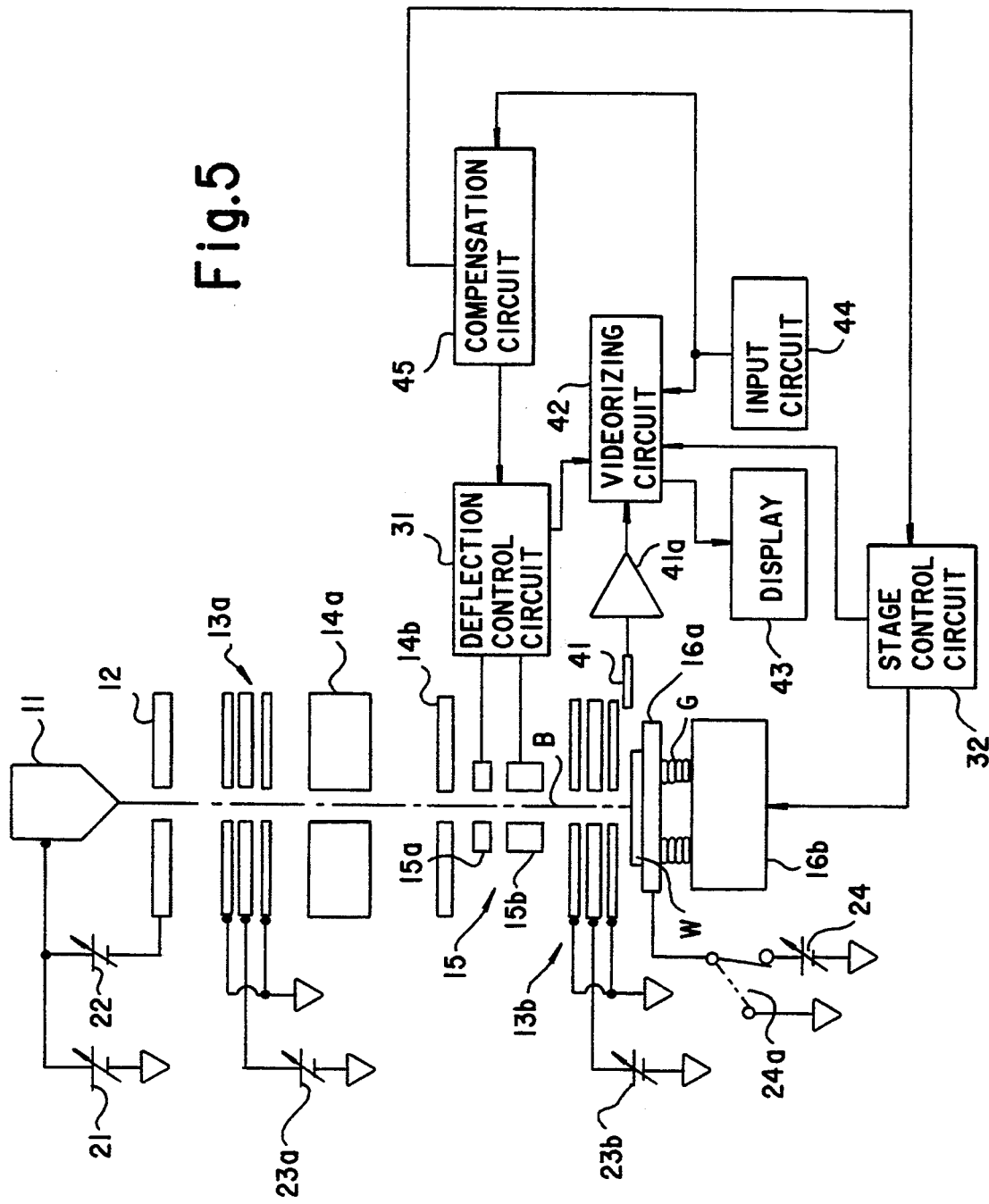
FIG. 5 is a schematic view including a block diagram showing the structure of the second example of the embodiment.

Referring to FIG. 5, a second example of the embodiment will be described, wherein the optical system has the same structure as that illustrated in FIGS. 1 to 3:

A target W is placed on a holder 16a supported by a stage 16b through insulators G. A decelerating source 24, provided to form a decelerating field, is connected to the holder 16a through a switch 24a. When the switch 24a is closed, a decelerating field is formed between the holder 16a and the outermost electrode 130b.

The stage 16b is connected to a driving mechanism (not shown) which horizontally moves the stage 16b when a signal is applied thereto from a stage control circuit 32.

There are provided a secondary electron detector 41 adjacent to the holder 16a and an amplifier 41a which amplifies the output of the detector 41 before it is sent to a videorizing circuit 42.

The videorizing circuit 22 receives an output from the detector 41, beam deflection information from a deflection control circuit 31 and stage position information from a stage control circuit 32. The videorizing circuit 42 transforms an output from the detector 41 into a pixel density signal, and transforms beam deflection information and stage position information into an image representing a position signal. The SIM image is displayed on a display 43.

The videorizing circuit 42 includes an image composite circuit whereby the shape and position of a pattern to be deposited is input to the display 43 through an input unit 44 such as a key board and a mouth. The content of the input information is displayed as a composite SIM image.

The information from the input unit 44 is also supplied to a compensation circuit 45 which stores information about difference in beam path occurring when a decelerating field is formed and when it is not formed. More specifically, this information indicates how the depositing pattern is enlarged and displaced from an intended position depending upon the existence of a decelerating field, at the moment when the beam reaches the target W. The compensation circuit 45 compensates the content of the input from the input unit 44 by the displacement in beam path due to the existence of the decelerating field, and then supplies the compensated date as a scanning control signal to the deflection control circuit 31 and stage control circuit 32.

The videorizing circuit 42, input unit 44 and compensation circuit 45 are constituted by a computer and its peripheral devices.

In operation, a target or specimen W is placed on the holder 16a and an SIM image is obtained. With the switch 24a being open, which means that a decelerating field is not formed, the ion beam B is deflected and at the same time, the stage 16b is moved. In this way the secondary electrons emitted from the target W are caught by the secondary electrons detector 41, and an SIM image is displayed on the display 43 on the basis of beam deflection information and stage position information.

The operator can identify the position of a marking etc. on the target W by reference to the SIM image, and input the shape and position of the pattern to be deposited through the input unit 44.

The switch 24a is closed to generate an ion beam B with the formation of a decelerating field. In this way a scanning control signal from the compensation circuit is supplied to the deflection control circuit 31 and stage control circuit 32 so as to deflect the beam B automatically or move the stage 16b, thereby forming a desired pattern as it is initially wanted.

Figure 6:
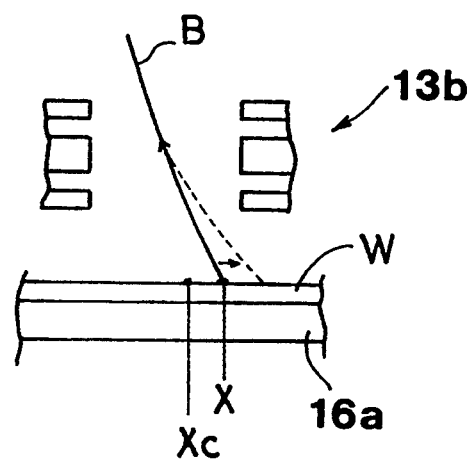
FIG. 6 is a schematic view showing the occurrence of a deflection of an ion beam which depends upon the presence of a decelerating electric field, and also a method of correction by using the second example.

In FIG. 6, the full line indicates a beam path B obtained when no decelerating field is formed and when the beam is deflected as desired. When a decelerating field is formed, the beam path B takes the trace indicated in dot-line under a lens-like action inherent to the field even though it is deflected. The deviation is previously written in the compensation circuit 45 as information. Now, suppose that an input from the input unit 44 is X, the compensation circuit 45 compensates X to $X_c$ so as to produce a scanning control signal and remedy the deviated beam path to the trace indicated by the full line.

Figure 7:
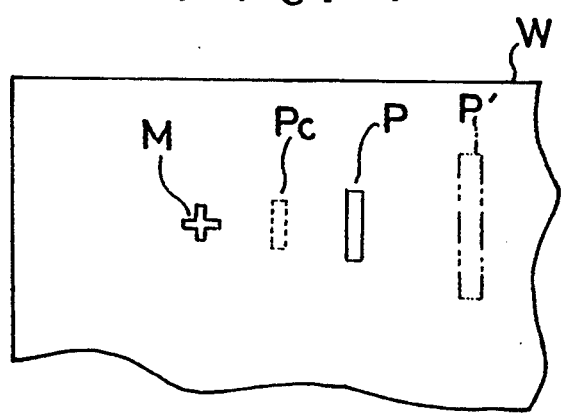
FIG. 7 is a schematic explanatory view exemplifying the operation of the second example.

Referring to FIG. 7, the above-mentioned action will be demonstrated by the use of a pattern on the target W:

A mark M is formed on the target W. Suppose that a deposition pattern is wanted at a position and to a size indicated by P. Data on P is input on the SIM image by the input unit 44. When a scanning control signal is supplied in accordance with the input data without any compensation while a decelerating field is formed, detrimental enlargement and deviation are brought about in the resulting pattern as shown by P'. The compensation circuit 45 produces a scanning control signal after it rewrites the information P into $P_c$. In this way, the actual deposited pattern matches with the pattern P.

What is claimed is:

1. A focused ion beam apparatus which comprises an ion source, an extraction electrode for extracting an ion beam from the ion source, a condenser lens for focusing the ion beam, a mass spectrometer for separating a desired ion species from the extracted ion beam, a target stage adapted to support a target, deflection electrodes for deflecting the ion beam taken from the mass spectrometer, and guiding same to the target on the stage, and an objective lens located immediately before the target stage, and comprising a decelerating field circuit for forming a decelerating field between the target stage and an outermost electrode of the objective lens, the deflection electrodes having a two-stage structure consisting of a first and second group of deflection electrodes in the advancing direction of the ion beam, wherein the ion beam deflected by the deflection electrodes is caused to pass through the center of the objective lens irrespective of the amount of beam deflection.

2. The apparatus of claim 1, wherein the objective lens comprises a three-electrode electrostatic lens of which the central electrode is connected to a source while the opposite two electrodes are connected to earth so that the target stage is positively charged.

3. The apparatus of claim 1, wherein each of the two-stage deflection electrodes comprises an even number of pole pieces with the same central axis in common, and wherein diametrically opposite pairs of pole pieces in each group of deflection electrode are charged with potential of opposite polarity, and wherein the second group of electrodes is two times longer than the first group of electrodes, vertically aligned pairs of pole pieces of the first and second group of deflection electrodes being charged with potential of the same polarity, the central electrode of the objective lens being located away from the center of the second deflection electrode by a center-to-center distance of the first and second group of deflection electrodes.

4. The apparatus of claim 3, wherein the diametrically opposite pairs of pole pieces of each deflection electrode are connected to the same deflection source.

5. The apparatus of claim 1, wherein the first and second group of deflection electrodes each comprise a plurality of pole pieces having the central axis in common, the diametrically opposite pairs of pole pieces in each group of deflection electrodes are charged with potential of opposite polarity, wherein the potential imparted to the diametrically opposite pole pieces is adjustable so as to enable the deflected ion beam to pass through the center of the objective lens.

6. The apparatus of claim 5, wherein the first and second group of deflection electrodes have the same length in the advancing direction of the ion beam, and wherein the central electrode of the objective lens is located away from the second group of deflection electrode by a center-to-center distance of the first and second group, each electrode in the second group being charged with voltage two times larger than that imparted to the electrodes diametrically opposite thereto in the first group.

7. The apparatus of claim 5, wherein the center of the objective lens is located at a point through which the ion beam passes irrespective of the amount of beam deflection, depending upon the lengths of the first and second group of deflection electrodes and a ratio of voltages imparted to each group.

8. A focused ion beam apparatus which comprises an ion source, an extraction electrode for extracting an ion beam from the ion source, a plurality of lenses for focusing the ion beam, a mass spectrometer for separating a desired ion species from the extracted ion beam, a target stage adapted to support a target, a beam scanning means for determining an ion beam incident position of the ion beam separated by the mass spectrometer, means for forming a decelerating field immediately before the target stage, an SIM image detector located adjacent to the target stage, a videorizing means for visualizing an SIM image on the basis of an output from the detector and information from the beam scanning means, an input unit for inputting data on the shape and position of a pattern to be deposited by the incident ion beam by reference to the SIM image formed by the videorizing means, and a compensation means for supplying a control signal to the beam scanning means after the input is appropriately compensated, the compensation means being capable of compensating the content of the input in response to a beam path deviation occurring when a decelerating field is formed, against when no decelerating field is formed.

9. The apparatus of claim 8, wherein the beam scanning means comprises deflection electrodes, a circuit for imparting deflecting voltage thereto, and a stage control means, and wherein an objective lens of the plurality of lenses is located immediately before the target stage a circuit for forming a decelerating field between an outermost electrode in the objective lens and the target stage, the deflection electrodes comprising a first group and a second group, wherein the deflected beam passes through the center of the objective lens irrespective of the amount of deflection.

* * * * *